United States Patent
Tanaka

(10) Patent No.: US 9,434,151 B2
(45) Date of Patent: Sep. 6, 2016

(54) LED UNIT

(75) Inventor: Takashi Tanaka, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 188 days.

(21) Appl. No.: 13/521,783

(22) PCT Filed: Dec. 30, 2010

(86) PCT No.: PCT/IB2010/003368
§ 371 (c)(1),
(2), (4) Date: Jul. 12, 2012

(87) PCT Pub. No.: WO2011/086416
PCT Pub. Date: Jul. 21, 2011

(65) Prior Publication Data
US 2013/0056767 A1   Mar. 7, 2013

(30) Foreign Application Priority Data
Jan. 18, 2010 (JP) ................. 2010-008313

(51) Int. Cl.
*B41F 23/04* (2006.01)
*B41J 11/00* (2006.01)
*H01L 25/075* (2006.01)

(52) U.S. Cl.
CPC ....... *B41F 23/0486* (2013.01); *B41F 23/0453* (2013.01); *B41J 11/002* (2013.01); *H01L 25/0753* (2013.01); *H01L 2224/48137* (2013.01)

(58) Field of Classification Search
USPC .......................................... 257/89
See application file for complete search history.

(56) References Cited

U.S. PATENT DOCUMENTS

| | | | | |
|---|---|---|---|---|
| 5,838,247 A * | 11/1998 | Bladowski | ............... | 340/815.45 |
| 6,250,774 B1 * | 6/2001 | Begemann et al. | .......... | 362/231 |
| 7,285,903 B2 * | 10/2007 | Cull et al. | ..................... | 313/500 |
| 7,513,639 B2 * | 4/2009 | Wang | ............................. | 362/218 |
| 7,631,985 B1 * | 12/2009 | Knoble et al. | ................ | 362/225 |

(Continued)

FOREIGN PATENT DOCUMENTS

| | | |
|---|---|---|
| JP | H10190058 | 7/1998 |
| JP | 2004363352 | 12/2004 |

(Continued)

OTHER PUBLICATIONS

The International Search Report for PCT/IB2010/003368.

(Continued)

*Primary Examiner* — Mohammad Islam
*Assistant Examiner* — Ankush Singal
(74) *Attorney, Agent, or Firm* — Bacon & Thomas, PLLC

(57) ABSTRACT

An LED unit includes: a plurality of LED modules each having an LED chip for generating ultraviolet ray provided in a package which has an opening formed on one surface and a lens formed to cover the opening of the package; a substrate-shaped base block where the LED modules are mounted in a first direction; and a heat radiation member where a plurality of the base blocks is provided in a second direction perpendicular to the first direction. The heat radiation member has a plurality of inclined surfaces where each of the base blocks is disposed. Further, one inclined surface and the other inclined surface of the heat radiation member are inclined to face each other in the second direction.

13 Claims, 14 Drawing Sheets

(56) References Cited

U.S. PATENT DOCUMENTS

| | | | |
|---|---|---|---|
| 7,726,851 B2* | 6/2010 | Shuai et al. | 362/373 |
| 7,806,560 B2* | 10/2010 | Schultz et al. | 362/249.02 |
| D632,416 S* | 2/2011 | Wright et al. | D26/71 |
| 8,016,408 B2* | 9/2011 | Sugai | 347/102 |
| 8,025,421 B2* | 9/2011 | Ku | 362/231 |
| 8,100,553 B2* | 1/2012 | Chen et al. | 362/240 |
| 8,308,318 B2* | 11/2012 | Maxik | 362/231 |
| 8,408,737 B2* | 4/2013 | Wright et al. | 362/247 |
| 8,465,176 B2* | 6/2013 | Jang | 362/249.06 |
| 2003/0059722 A1* | 3/2003 | Kamijima | 430/311 |
| 2004/0120152 A1* | 6/2004 | Bolta et al. | 362/294 |
| 2004/0166249 A1* | 8/2004 | Siegel | 427/558 |
| 2004/0170019 A1* | 9/2004 | Tamai | 362/231 |
| 2004/0179079 A1* | 9/2004 | Yokoyama | 347/102 |
| 2005/0041436 A1 | 2/2005 | Ishida | |
| 2005/0099478 A1* | 5/2005 | Iwase | 347/102 |
| 2005/0218468 A1* | 10/2005 | Owen et al. | 257/433 |
| 2006/0007290 A1 | 1/2006 | Oshima et al. | |
| 2007/0109770 A1* | 5/2007 | Schmidt et al. | 362/118 |
| 2008/0080188 A1* | 4/2008 | Wang | 362/294 |
| 2008/0082000 A1* | 4/2008 | Thoms | 600/476 |
| 2008/0130299 A1* | 6/2008 | Dorogi | 362/373 |
| 2008/0151541 A1* | 6/2008 | Heffington et al. | 362/231 |
| 2008/0164482 A1* | 7/2008 | Obara et al. | 257/88 |
| 2009/0045422 A1* | 2/2009 | Kato et al. | 257/98 |
| 2009/0129103 A1* | 5/2009 | Zhang et al. | 362/373 |
| 2009/0160923 A1* | 6/2009 | Custer | 347/102 |
| 2009/0166665 A1* | 7/2009 | Haitko | 257/100 |
| 2009/0200477 A1* | 8/2009 | Takabatake | 250/370.08 |
| 2009/0213200 A1* | 8/2009 | Sugai | 347/102 |
| 2009/0309116 A1* | 12/2009 | Kato et al. | 257/98 |
| 2010/0059774 A1* | 3/2010 | Hatsuda et al. | 257/98 |
| 2010/0188849 A1* | 7/2010 | Luo et al. | 362/249.02 |
| 2010/0242299 A1* | 9/2010 | Siegel | 34/275 |
| 2010/0308709 A1* | 12/2010 | Mii | 313/485 |
| 2011/0002119 A1* | 1/2011 | Huang et al. | 362/249.02 |
| 2011/0143000 A1* | 6/2011 | Fiset | 426/248 |
| 2012/0218757 A1* | 8/2012 | Gill | 362/235 |
| 2013/0005055 A1* | 1/2013 | Lin et al. | 438/15 |

FOREIGN PATENT DOCUMENTS

| | | |
|---|---|---|
| JP | 200556704 | 3/2005 |
| JP | 2005203481 | 7/2005 |
| JP | 2005231261 | 9/2005 |
| JP | 3137249 | 11/2007 |
| JP | 3151132 | 6/2009 |
| JP | 2009-154436 | 7/2009 |
| WO | 2009133615 | 11/2009 |

OTHER PUBLICATIONS

Supplemental Search Report issued in EP 10 84 2938 on Oct. 26, 2012, 7 pages.

* cited by examiner

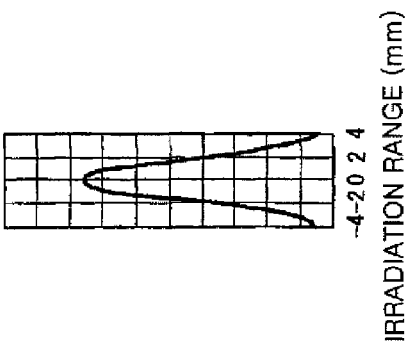
FIG. 14B
(PRIOR ART)
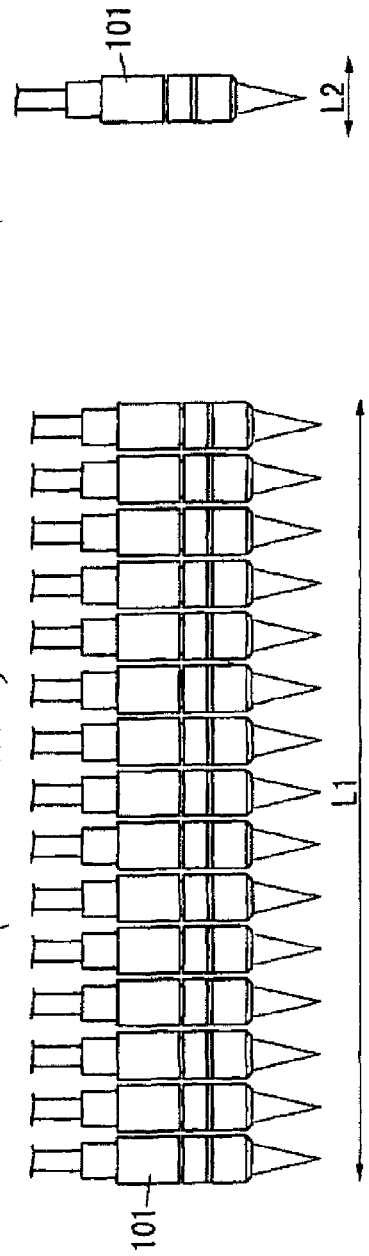
FIG. 14A
(PRIOR ART)
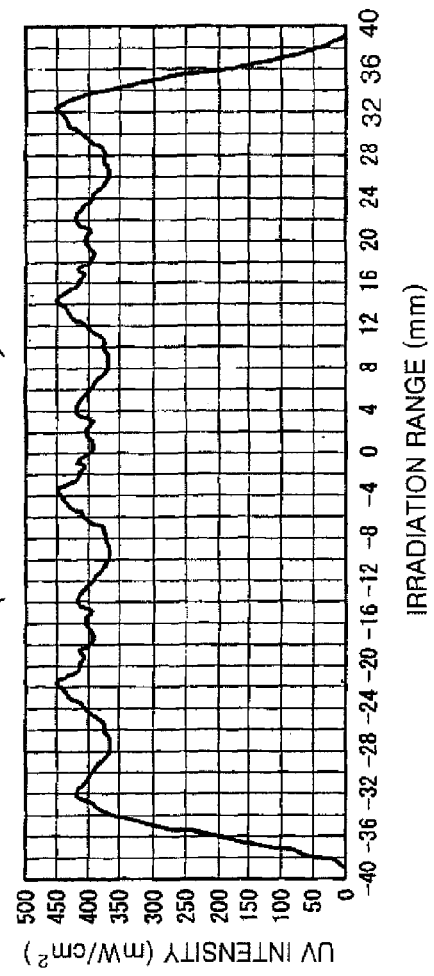
FIG. 14D
(PRIOR ART)
FIG. 14C
(PRIOR ART)

LED UNIT

FIELD OF THE INVENTION

The present invention relates to an LED unit.

BACKGROUND OF THE INVENTION

Conventionally, there is disclosed a printer which uses an ink being hardened by an ultraviolet ray irradiation. In the printer, an ultraviolet ray irradiation unit is provided at a rear end thereof such that the ink printed on a target object is hardened. Recently, as for the configuration of the ultraviolet ray irradiation unit, there have been suggested various configurations, each using an LED (light emitting diode) unit as a light source instead of a discharge lamp in view of lowering power consumption and extending life span (see, e.g., patent document 1 and patent document 2).

The LED unit requires to irradiate ultraviolet rays over a wide range in a width direction of the target object, so that an irradiation portion thereof generally has a thin and long line shape. For example, as shown in FIGS. 14A and 14B, there is an LED unit where a plurality of LED modules 101 is installed in one row, each of the LED modules 101 having a lens and an LED chip therein and irradiating ultraviolet rays through the lens. Accordingly, the light is characterized to be irradiated in a line shape. FIG. 14C shows an ultraviolet ray intensity over an irradiation range in a width direction L1 of the LED unit seen from a front portion of the LED unit, and FIG. 14D shows an ultraviolet ray intensity over an irradiation range in a lengthwise direction L2 seen from a side portion of the LED unit.

[Patent Document 1] Japanese Utility Model Registration No. 3151132

[Patent Document 2] Japanese Patent Application Publication No. 2005-203481

The LED unit requires an improvement in the ultraviolet irradiation intensity and uniformity in the irradiation intensity distribution. Moreover, high-density installation using a plurality of LED elements has been attempted. In order to realize the high-density installation, a single LED module has therein a plurality of LED chips. Or, a plurality of LED modules is provided in multiple rows and columns to perform surface emitting.

In order to improve the ultraviolet ray irradiation intensity, there is also disclosed an LED unit in which LED modules 101 as shown in FIG. 14 are arranged in multiple rows (FIGS. 15A and 15B show two rows and three rows arrangement, respectively) such that the irradiation ranges of the LED modules 101 are overlapped with each other, as shown in FIGS. 15A and 15B, for example. However, a fixing member, e.g., a bracket or the like, for adjusting the irradiation directions of the LED modules 101 is required to control the irradiation ranges of the LED modules 101. This leads to an increased number of components and a complicated configuration.

The densely installed LED elements require a heat radiation unit for suppressing a temperature increase, because the heat generation from the LED elements decreases luminous efficiency. For example, each of the configurations shown in FIGS. 14 and 15 includes an air-cooling structure using a heat radiation member made of metal (not shown) or the like. In addition, an LED module employing as a heat radiation unit a water-cooling structure using a coolant is suggested.

However, there has been developed no LED unit with a heat radiation unit capable of improving an ultraviolet ray irradiation intensity and achieving uniform irradiation intensity distribution with a simple configuration.

SUMMARY OF THE INVENTION

In view of the above, the present invention provides an LED unit having a heat generation unit and capable of improving an ultraviolet ray irradiation intensity and achieving uniform irradiation intensity distribution with a simple configuration.

In accordance with an aspect of the present invention, there is provided an LED unit including: a plurality of LED modules each having an LED chip for generating ultraviolet ray provided in a package which has an opening formed on one surface and a lens provided to cover the opening of the package; substrate-shaped base blocks on each of which the LED modules are arranged in a first direction; and a heat radiation member where the base blocks are provided in a second direction perpendicular to the first direction, wherein the heat radiation member has a plurality of inclined surfaces where the base blocks are respectively disposed, and the inclined surfaces opposite to each other in the second direction are inclined toward each other in the second direction.

With such configuration, the improvement in the ultraviolet ray irradiation intensity and the uniformity in the irradiation intensity distribution can be realized with a simple configuration employing the heat generation unit. Therefore, the hardening characteristics of the ultraviolet ray hardening ink can be sufficiently obtained while reducing the number of LED modules. Furthermore, the ultraviolet ray irradiation intensity and the irradiation intensity distribution can be set to desired levels by adjusting the inclination angles of the inclined surfaces.

The heat radiation member may be divided into a plurality of portions in the second direction, each portion having an inclined surface, and the base blocks may be provided at the inclined surfaces of the divided portions.

With this configuration, the heat radiation member is divided into multiple portions, and the heat radiation of each portion can be properly controlled. Moreover, a desired irradiation range can be obtained by adjusting the division number of the heat radiation member. Besides, by standardizing the shape, size, division method and the like of the divided portions of the heat radiation member, it is possible to provide LED units with various specifications while reducing the cost.

The lens may be directly coupled to the package.

By doing so, it is possible to provide an optical system having the LED modules with a simplified configuration.

Further, the LED unit may include a lens provided on an irradiation path of ultraviolet rays from the LED modules.

With such configuration, since the lens is provided on the path of the ultraviolet rays emitted from the LED module, it is possible to optimize the optical system and improve the irradiation efficiency by controlling the distribution of ultraviolet rays irradiated from the lens.

Preferably, the lens disposed on the irradiation path of the ultraviolet rays is formed of a cylindrical lens, and a single cylindrical lens may be disposed so as to correspond to at least two of the LED modules adjacent to each other in the first direction.

With such configuration, the irradiation intensity distribution of the ultraviolet rays in the first direction becomes more uniform, so that the light distribution can be easily controlled.

It is preferred that the LED modules mounted on one of the base blocks and the LED modules mounted on another of the base blocks adjacent thereto in the second direction are staggered in the first direction.

Accordingly, the irradiation intensity distribution of ultraviolet rays in the first direction becomes more uniform, and the light distribution can be further easily controlled.

It is characterized in that the LED modules arranged in the first direction are different in wavelengths of ultraviolet rays emitted therefrom on a row basis in the first direction.

With this configuration, the control of the ultraviolet ray irradiation intensity and the irradiation intensity distribution on a wavelength basis can be easily carried out by controlling the light distribution on a row basis. Hence, selectable types of inks in accordance with printing conditions (a printing speed, the amount of ink and the like) are increased. This makes it possible to reduce the ink cost.

Further, at least one of the LED modules arranged in the first direction may irradiate an ultraviolet ray having a different wavelength from that of other LED modules.

With such configuration, the control of the ultraviolet ray irradiation intensity and the irradiation intensity distribution on a wavelength basis can be easily performed by controlling the illumination of the LED modules individually. Therefore, selectable types of inks are increased in accordance with printing conditions (a printing speed, the amount of ink and the like), and the ink cost can be reduced. Further, since the LED modules having different emission wavelengths are arranged in the same row, multiple wavelengths can be mixed regardless of the number of rows (the number of inclined surfaces).

BRIEF DESCRIPTION OF THE DRAWINGS

The objects and features of the present invention will become apparent from the following description of embodiments, given in conjunction with the accompanying drawings, in which:

FIGS. 14A, 14B, 14C, and 14D schematically show a conventional LED unit and corresponding ultraviolet ray intensities related thereto.

DETAILED DESCRIPTION OF THE EMBODIMENTS

Figure 1A:
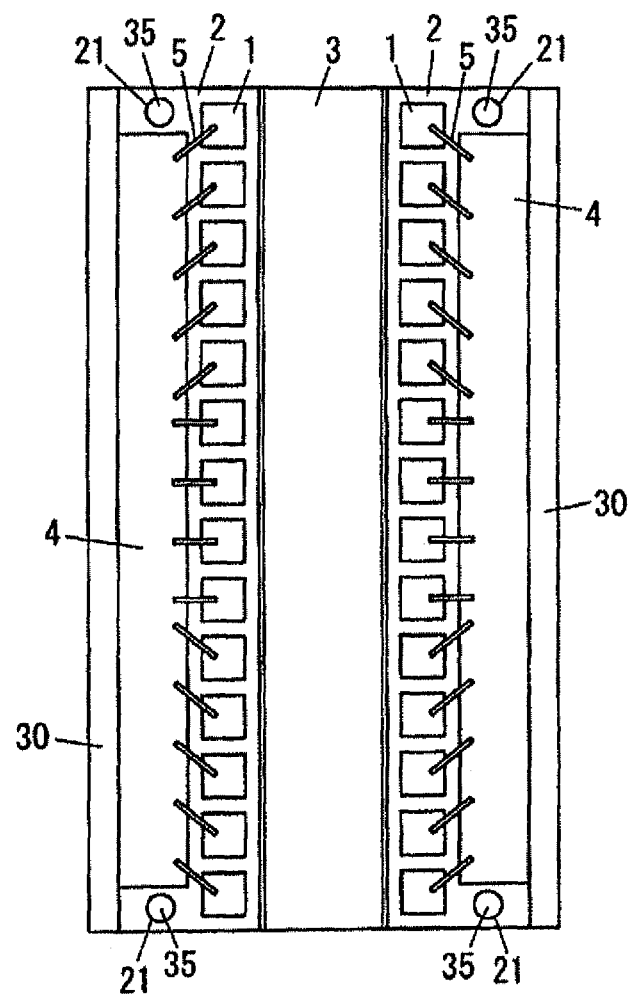
FIGS. 1A and 1B are plan views showing a configuration of an LED unit in accordance with a first embodiment of the present invention.

Hereinafter, embodiments of the present invention will be described with reference to the accompanying drawings which form a part hereof. Throughout the drawings, like reference numerals refer to like or similar parts, and redundant description thereof will be omitted.

(First Embodiment)

Figure 1B:
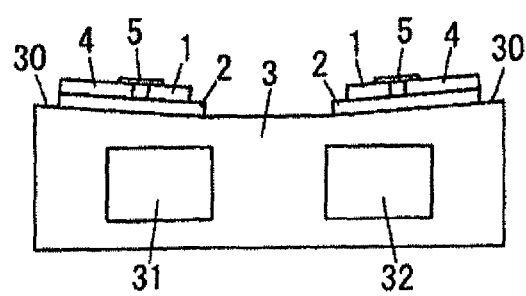

An ultraviolet ray irradiation unit that irradiates ultraviolet rays to harden ink printed on a target object is installed at a rear end of a printing unit for performing printing on the target object by using ink that can be hardened by irradiation of ultraviolet rays. An LED unit of the present embodiment is used in the ultraviolet ray irradiation unit and has a configuration in which two base blocks 2, each having a plurality of LED modules 1 mounted thereon, are arranged on a heat radiation member 3, as shown in FIGS. 1A and 1B.

Figure 2:
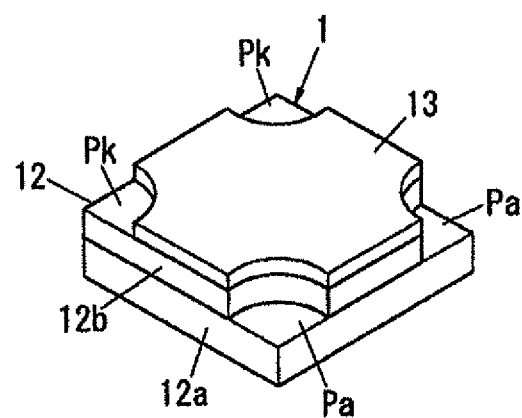
FIG. 2 is a perspective view showing the configuration of the LED unit in accordance with the first embodiment.
Figure 3:
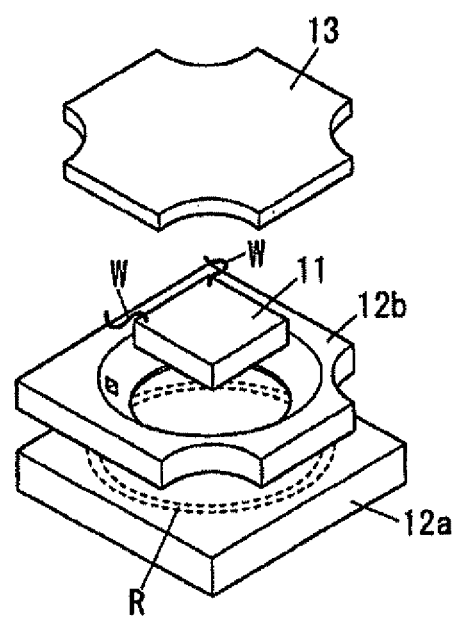
FIG. 3 is an exploded perspective view showing the configuration of the LED module in accordance with the first embodiment.

As shown in FIGS. 2 and 3, each of the LED modules 1 includes an LED chip 11, a package 12 accommodating therein the LED chip 11, and a lens 13 covering an opening in the package 12. The package 12 includes a sub-mount substrate 12a having a top surface to which the LED chip 11 is AuSn-bonded, and a frame 12b that is AuSn-bonded to the top surface of the sub-mount substrate 12a so as to surround the LED chip 11.

The sub-mount substrate 12a is made of AlN (aluminum nitride) and has both surfaces plated with Au (gold). The top surface facing the frame 12b is plated with AuSn (gold-tin) in a ring shape (R area in FIG. 3). The frame 12b is made of $Al_2O_3$ (aluminum oxide) or the like having a comparatively high thermal conductivity and a thermal expansion coefficient close to that of AlN among insulating materials. The top surface of the frame 12b is plated with Au. The bottom surface thereof facing the sub-mount substrate 12a is plated with AuSn in a ring shape.

The lens 13 is made of optical glass and is AuSn-bonded to a peripheral portion of a ring-shaped opening in the frame 12b. Further, the lens 13 is plated with Au in a ring shape so as to face the periphery of the opening in the frame 12. Due to the AuSn plating performed on each component, the sub-mount substrate 12a, the frame 12b and the optical glass 13 are AuSn-boned to each other. The sub-mount substrate 12a may be made of another material other than AlN, and the frame 12b may be made of another material other than $Al_2O_3$. The sub-mount substrate 12a and the frame 12b may be formed as one unit.

The LED chip 11 is, e.g., an ultraviolet ray LED chip having a peak wavelength in an ultraviolet range. A bonding wire of an anode of the LED chip 11 is connected to the Au plated portion on the top surface of the sub-mount substrate 12a (or the frame 12b) by die bonding, and a bonding wire of a cathode thereof is connected to the Au plated portion on the top surface of the frame 12b (or the sub-mount substrate 12a) by wire bonding. In other words, the anode of the LED chip 11 is electrically connected to the gold plated portion (anode electrode Pa) on the top surface of the sub-mount substrate 12a, and the cathode thereof is electrically connected to the gold plated portion (cathode electrode Pk) on the top surface of the frame 12b.

Accordingly, the anode electrode Pa and the cathode electrode Pk can be formed in upper and lower layers of the package 12, and this allows scaling down of the package 12. Moreover, the anode of the LED chip 11 may be electrically connected to the gold plated portion on the top surface of the frame 12b, and the cathode thereof may be electrically connected to the gold plated portion on the top surface of the sub-mount substrate 12a.

Meanwhile, the sub-mount substrate 12a is made of AlN having the same linear expansion coefficient as that of the LED chip 11 and is disposed between the LED chip 11 and the heat radiation member 3. Thus, the sub-mount substrate 12a reduces the stress applied to the LED chip 11 due to a thermal expansion difference between the LED chip 11 and the heat radiation member 3 and has a function of quickly diffusing heat generated from the LED chip 11 horizontally and vertically. As a result, the heat resistance is reduced.

Figure 4A:
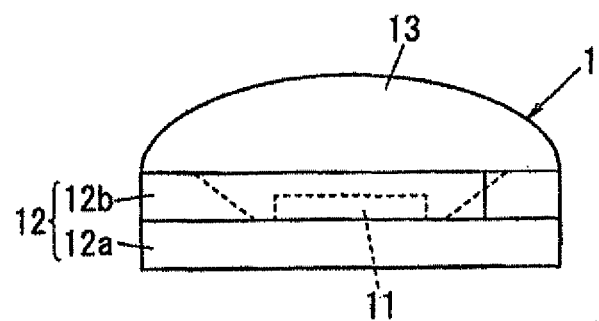
FIGS. 4A and 4B are side views showing the configuration of the LED module in accordance with the first embodiment.
Figure 4B:
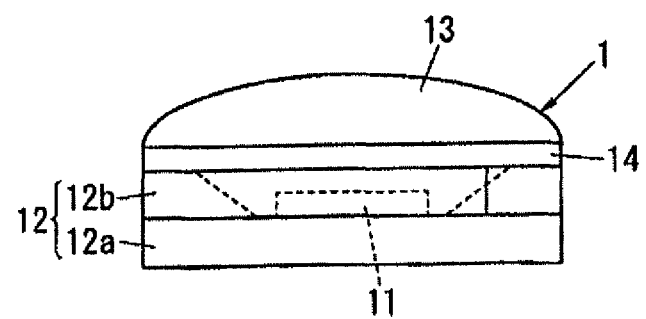

In the LED module 1, the package 12 and the lens 13 are assembled as one unit by directly coupling the lens 13 of the LED module 1 to the package 12 (e.g., AuSn bonding, bonding using adhesive or the like), as shown in FIG. 4A. Hence, the configuration of the optical system including the LED module 1 can be simplified. Besides, the package 12 and the lens 13 may be assembled as one unit by disposing a cover 14 made of glass to cover the opening of the package 12 and coupling the lens 13 to the cover 14a, as shown in FIG. 4B.

The base block 2 is formed of a rectangular substrate, and a plurality of LED modules 1 is mounted thereon in a lengthwise direction (first direction) at a regular interval. In order to attach the LED modules 1 to the base block 2, the bottom surface of the sub-mount substrate 12a of the LED module 1 is directly coupled to the surface of the base block 2 by soldering, adhesive or the like. Thus, it is unnecessary to form a screw hole for fixing the LED module by a screw, and the LED module 1 can be scaled down. Accordingly, the LED modules 1 can be installed with high density.

The LED module 1 may be coupled to the base block 2 by using a thermally conductive adhesive. The thermally conductive adhesive may be a conductive adhesive having a high thermal conductivity obtained by mixing a resin such as epoxy or the like having a fixing function and a metal such as silver or the like having a conductive function, or an insulating adhesive made of a material having a high insulation property and high thermal conductivity.

The heat radiation member 3 is formed of a rectangular parallelepiped copper plate and has on one surface thereof two inclined surfaces 30 where the base blocks 2 on which the LED modules 1 are mounted are arranged in two rows along a width direction (second direction). The two inclined surfaces 30 are formed at both sides in the width direction of the rectangular heat radiation member 3 and thus are inclined in directions facing each other. In other words, in FIG. 1E, the inclined surface 30 located at the left side is inclined in a clockwise rotational direction whereas the inclined surface 30 located at the right side is inclined in a counterclockwise rotational direction.

In each of the inclined surfaces 30, screw holes 35 are bored at both ends in the lengthwise direction thereof. The base block 2 is attached to the inclined surfaces 30 by screw-coupling screws (not shown) insertion-fitted through holes 21 formed at both ends in the lengthwise direction of the base block 2 to the screw holes 35. The base block 2 may be attached to the inclined surfaces 30 by using adhesive or the like, other than screw fixation.

In the LED modules 1 mounted on the base block 2, the irradiation directions of the ultraviolet rays are determined by inclination angles of the inclined surfaces 30 where the base blocks 2 are provided. The inclination angles are set such that the improvement in the ultraviolet ray irradiation intensity and the uniformity in the irradiation intensity distribution are obtained. Hence, in the present embodiment, the inclination angles of the two inclined surfaces 30 are set such that the irradiation ranges of the ultraviolet rays from a pair of LED modules 1 facing each other in the width direction of the heat radiation member 3 are partially overlapped with each other.

As a consequence, the improvement in the ultraviolet ray irradiation intensity and the uniformity in the irradiation intensity distribution can be achieved, and the hardening characteristics of the ink can be sufficiently obtained while reducing the number of LED modules 1. Further, the ultraviolet ray irradiation intensity and the irradiation intensity distribution can be set to desired levels by adjusting the inclination angles of the two inclined surfaces 30. The magnitudes of the inclination angles of the two inclined surfaces 30 may be the same or different from each other.

By installing the inclined surfaces 30 at the heat radiation member 3, the heat radiation member 3 serves as the heat radiating unit of the LED module 1 as well as the irradiation direction setting unit of the LED module 1. Accordingly, a fixing member such as a bracket or the like for controlling the irradiation directions of the LED modules 1 is not necessary, and the number of components is reduced. As a result, the configuration can be simplified.

In FIGS. 1A and 1B, the LED module 1 is not installed at a plane area (area having an inclination angle of about 0°) between both inclined surfaces 30 of the heat radiation member 3. However, the LED module 1 may be installed by providing the base block 2 at the plane area between both inclined surfaces 30.

The heat radiation member 3 has therein a plurality of (two in the illustrated example) flow paths 31 and 32 for a coolant for cooing an LED chip. The flow paths 31 and 32 have substantially rectangular cross sections and are formed at the heat radiation member 3 in parallel to each other with a predetermined gap therebetween in a direction (width direction of the heat radiation member 3) perpendicular to the lengthwise directions of the flow paths 31 and 32 (lengthwise direction of the heat radiation member 3).

As for the coolant circulating through the flow paths 31 and 32, a known one such as water, silicon resin or the like is used. The flow paths 31 and 32 are formed to face the two base blocks 2, so that the heat generated by the LED modules 1 is transferred to the coolant passing through the flow paths 31 and 32 via the sub-mount substrate 12a, the base block 2 and the heat radiation member 3. Here, the bottom surface of the sub-mount substrate 12a is electrically insulated from the anode electrode Pa and the cathode electrode Pk, so that the insulation property of the heat radiation path is ensured.

Moreover, the heat resistance is reduced by Au plating performed on both surfaces of the sub-mount substrate 12a and the thermal diffusion function, and therefore, the heat radiation efficiency is improved. The cross sectional shapes of the flow paths 31 and 32 are not limited to a rectangular shape, and may be another shape such as a circular shape or the like.

Since the coolant absorbs heat while passing through the flow paths 31 and 32, the temperature of the coolant is lower at the inlet sides of the flow paths 31 and 32 than at the outlet sides of the flow paths 31 and 32. Thus, the cooling efficiency at the coolant inlet sides of the flow paths is comparatively high, and the cooling efficiency at the coolant outlet sides is comparatively low. As a result, the light emitting efficiency of the LED chip 11 becomes poor toward the coolant outlet sides.

In the present embodiment, the coolant is introduced into the flow path 31 from one end in the lengthwise direction of the heat radiation member 3 (upper side in FIG. 1A) and the coolant is introduced into the flow path 32 from the other end in the lengthwise direction of the heat radiation member 3 (lower side in FIG. 1A) so that the flow direction of the coolant in the flow path 31 and that in the flow path 32 are opposite to each other. In other words, the flow directions of the coolant in the flow paths 31 and 32 adjacent to each other are opposite to each other.

Accordingly, in the flow path 31, the temperature of the coolant at one end in the lengthwise direction of the heat radiation member 3 is lower than that at the other end in the lengthwise direction of the heat radiation member 3. In the flow path 32, the temperature of the coolant at the other end in the lengthwise direction of the heat radiation member 3 is lower than that at the one end in the lengthwise direction of the heat radiation member 3. Therefore, the temperature distribution of the coolant in the heat radiation member 3 becomes uniform.

This can reduce the non-uniformity in the temperature distribution in the heat radiation member 3 due to the higher temperature of the coolant at the coolant outlet side than that at the coolant inlet side and prevents the non-uniformity in the brightness of the light emitted from the LED chip 11 of the LED module 1. The number of the flow paths in the present embodiment is only an example, and the number of the flow paths may be greater than two.

In the LED unit of the present embodiment, the irradiation intensity and the irradiation intensity distribution of the ultraviolet rays irradiated from the LED modules 1 can be set to a desired level by providing the inclined surfaces 30 at the heat radiation member 3. Hence, the improvement in the ultraviolet ray irradiation intensity and the uniformity in the irradiation intensity distribution can be achieved with a simple configuration.

On the surface of the base block 2, a terminal base 4 is installed along the lengthwise direction of the base block 2 on which the LED modules 1 are mounted. The terminal base 4 is connected to a positive and a negative power supply line from a DC power supply (not shown). The bonding wires 5 extracted from the anode electrode Pa and the cathode electrode Pk formed at the package 12 of the LED modules 1 are respectively connected to a positive and a negative voltage of the terminal base by wire bonding (For simplicity, FIG. 1A shows a single bonding wire 5 between the terminal base 4 and each LED module 1 in a single base block 2). Accordingly, the LED modules 1 are connected in parallel to the DC power supply. The LED modules 1 may be connected in series to the DC power supply.

The connection type between the anode electrode Pa and the cathode electrode Pk of the LED module 1 and the terminal base 4 may vary without being limited to the wire bonding.

For example, the base block 2 and the terminal base 4 may be formed as one unit, and the anode electrode Pa and the cathode electrode Pk of the LED module 1 may be connected to the terminal base 4 by using a wiring pattern formed between the base block 2 and the terminal base 4. Further, an electronic part such as a Zener diode, a capacitor or the like may be installed at the terminal base 4, if necessary.

By installing the LED modules 1 and the terminal bases at the heat radiation member 3 as the above, the connection between the LED modules 1 and the power supply can be easily achieved, and the working efficiency is improved.

(Second Embodiment)

Figure 5A:
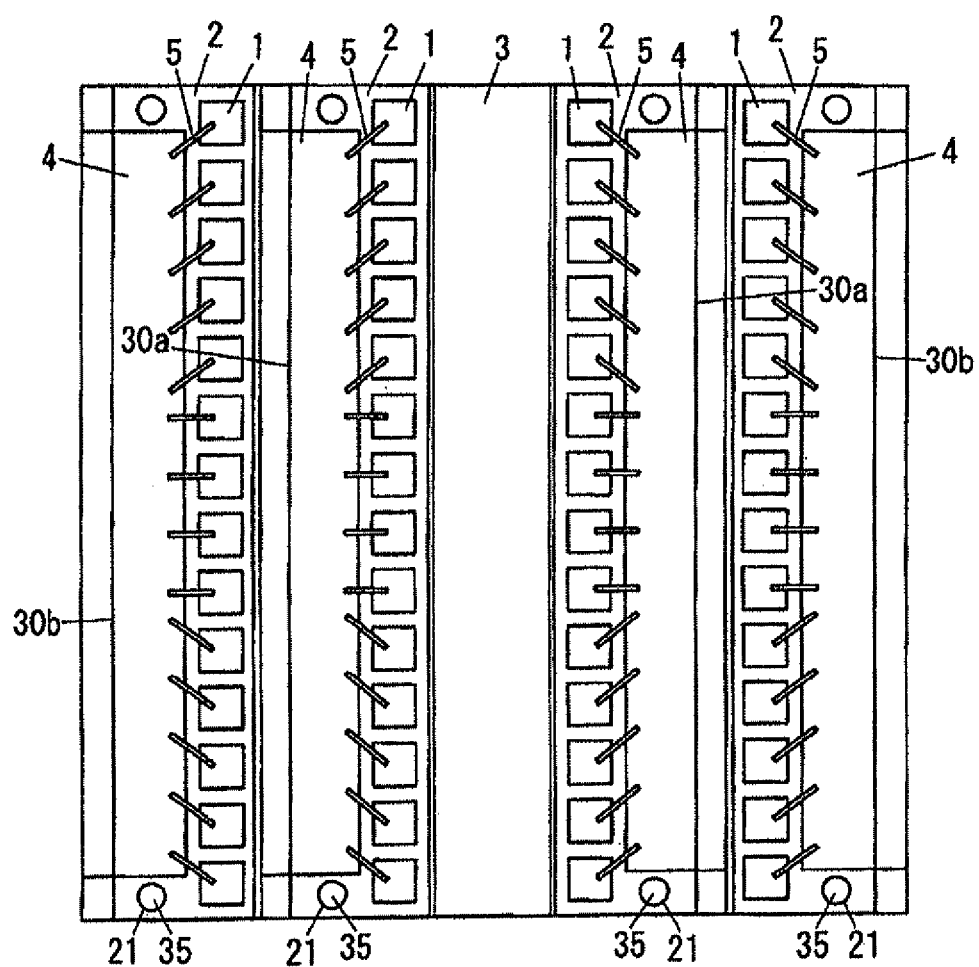
FIGS. 5A and 5B are plan views showing a configuration of an LED unit in accordance with a second embodiment of the present invention.
Figure 5B:
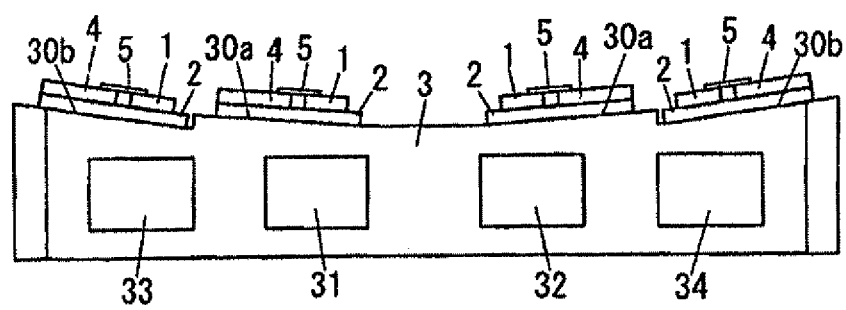

As shown in FIGS. 5A and 5B, the LED unit of the present embodiment is configured by providing four base blocks 2, on each of which a plurality of LED modules 1 is mounted, on the heat radiation member 3.

Therefore, the ultraviolet rays are irradiated in a wide range in a width direction of a target object, and the irradiation range in a lengthwise direction of the object is also expanded.

The heat radiation member 3 of the present embodiment is formed of a rectangular copper plate and serves as a supporting base having on one surface thereof two inclined surfaces 30a and 30b where the base blocks 2 on each of which the LED modules 1 are mounted are arranged in four rows along a lengthwise direction.

The inclined surfaces 30a have a rectangular shape elongated along the lengthwise direction of the heat radiation member 3 and are formed at the central portion in the width direction of the heat radiation member 3. Thus, the two inclined surfaces 30a are inclined in opposite directions. The inclined surfaces 30b have a rectangular shape elongated along the width direction of the heat radiation member 3 and are formed at both outer sides in the width direction of the heat radiation member 3. Hence, the two inclined surfaces 30b are inclined in opposite directions.

In other words, in FIG. 5B, the inclined surfaces 30a and 30b located at the left side are inclined in a clockwise rotational direction, and the inclined surfaces 30a and 30b located at the right side are inclined in a counterclockwise rotational direction. That is, the inclined surfaces 30a and 30b of one side and the inclined surfaces 30a and 30b of the other side in the width direction of the heat radiation member 3 are inclined in the opposite directions.

In each of the inclined surfaces 30a and 30b, screw holes 35 are bored at both ends in the lengthwise direction of the heat radiation member 3. By screw-coupling screws (not shown) insertion-fitted through holes 21 formed at both ends in the lengthwise direction of the base block 2 to the screw holes 35, a single base block 2 is attached to a single inclined surface 30a or 30b.

In the LED modules 1 mounted on the base block 2, the irradiation directions of the ultraviolet rays are determined by the inclination angles of the inclined surfaces 30a or 30b where the base blocks 2 are provided. The inclination angles of the inclined surfaces 30a are set such that the irradiation ranges of the ultraviolet rays from a pair of LED modules 1 facing each other in the width direction of the heat radiation member 3 are partially overlapped with each other.

Further, the inclination angles of the inclined surfaces 30b are set such that the irradiation ranges of the ultraviolet rays from the LED modules 1 on the inclined surfaces 30b are partially overlapped with the irradiation ranges of the ultraviolet rays from the LED modules 1 on the inclined surfaces 30a adjacent thereto in the width direction of the heat radiation member 3. Hence, the improvement in the ultraviolet ray irradiation intensity and the uniformity in the irradiation intensity distribution can be achieved, and the irradiation range in the lengthwise direction of the object can be expanded.

Furthermore, the ultraviolet ray irradiation intensity and the irradiation intensity distribution can be set to a desired level by adjusting the inclination angles of the inclined surfaces 30a and 30b. The magnitudes of the inclination angles of the inclined surfaces 30a and 30b may be the same or different from each other.

By installing the inclined surfaces 30a and 30b at the heat radiation member 3, the heat radiation member 3 serves as the heat radiating unit of the LED module 1 and the irradiation direction setting unit of the LED module 1. Accordingly, a fixing member such as a bracket or the like for controlling the irradiation direction of the LED modules 1 is not required, and the number of components is reduced. As a result, the configuration can be simplified.

In FIGS. 5A and 5B, the LED module 1 is not installed at a plane area (area having an inclined angle of about 0°) between both inclined surfaces 30a of the heat radiation member 3. However, the LED module 1 may be installed by providing the base block 2 at the plane area between both inclined surfaces 30a.

Further, flow paths 31 to 34 are formed at the heat radiation member 3 so as to face four base blocks 2. Thus, the heat produced by the LED modules 1 is transferred to the coolant passing through the flow paths 31 to 34 via the sub-mount substrate 12a, the base block 2 and the heat radiation member 3.

Furthermore, in this embodiment, the coolant is introduced into the flow paths 31 and 34 from one end in the lengthwise direction of the heat radiation member 3 (upper side in FIG. 5A) and the coolant is introduced into the flow paths 32 and 33 from the other end in the lengthwise direction of the heat radiation member 3 (lower side in FIG. 5A) so that the flow direction of the coolant in the flow paths 31 and 34 is opposite to that of the coolant in the flow paths 32 and 33. In other words, the flow direction of the coolant in the flow paths 31 and 34 is opposite to that of the coolant in the flow paths 32 and 33.

Accordingly, in the flow paths 31 and 34, the temperature of the coolant at the one end in the lengthwise direction of the heat radiation member 3 is lower than that at the other end in the lengthwise direction of the heat radiation member 3. In the flow paths 32 and 33, the temperature of the cooling medium at the other end in the lengthwise direction of the heat radiation member 3 is lower than that at the one end in the lengthwise direction of the heat radiation member 3. As a result, the temperature distribution of the coolant in the heat radiation member 3 becomes uniform.

This can reduce the non-uniformity in the temperature distribution in the heat radiation member 3 due to the higher temperature of the coolant at the coolant outlet side than that at the coolant inlet side and prevent the non-uniformity in the brightness of the light emitted from the LED chip 11 of the LED module 1. The number of the flow paths in the present embodiment is only an example, and the number of the flow paths may be greater than four.

In the LED unit of the present embodiment as the above, the irradiation intensity of ultraviolet rays from the LED modules 1 and the irradiation intensity distribution thereof can be set to a desired level by providing the inclined surfaces 30a and 30b at the heat radiation member 3. Hence, the improvement in the ultraviolet ray irradiation intensity and the uniformity in the irradiation intensity distribution can be achieved with a simple configuration.

The terminal base 4 is mounted on one side of the heat radiation member 3 along the lengthwise direction of each base block 2. Hence, as in the first embodiment, a plurality of LED modules 1 is connected in parallel to a DC power supply via the terminal base 4.

Like reference numerals refer to like parts in the first embodiment, and redundant description thereof has been omitted.

(Third Embodiment)

Figure 6A:
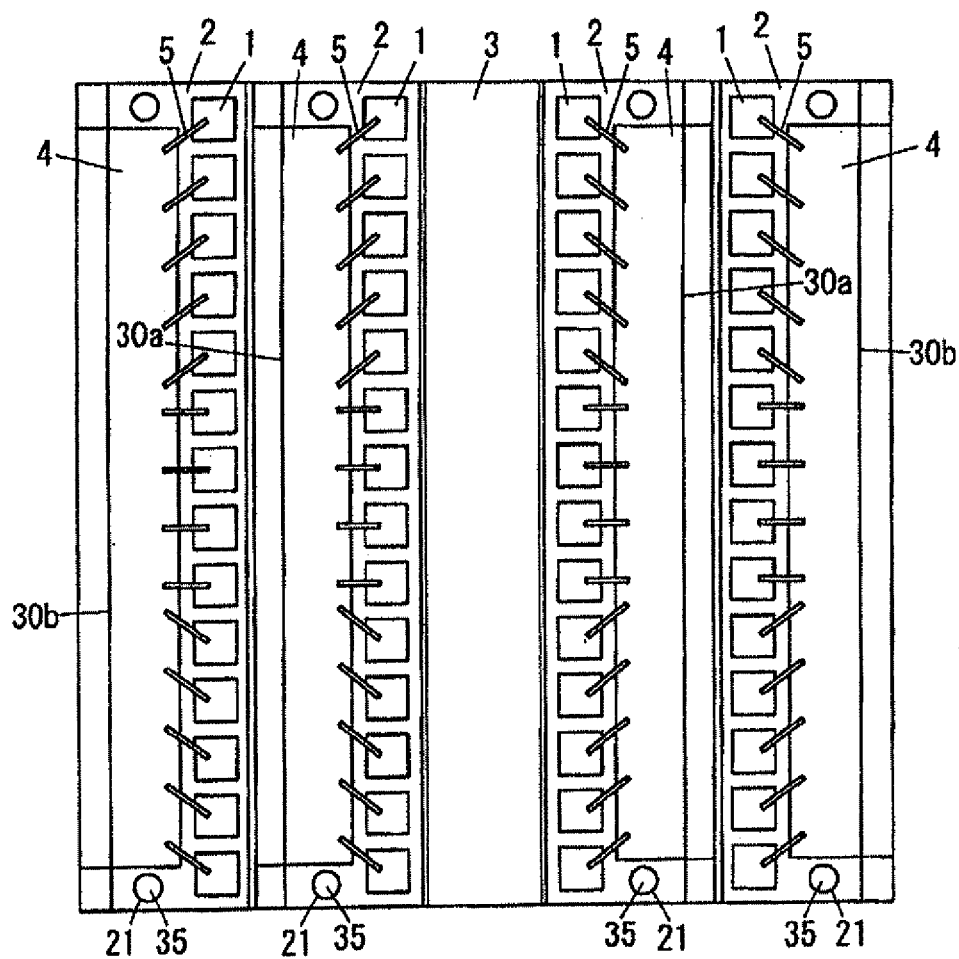
FIGS. 6A and 6B are plan views showing a configuration of an LED unit in accordance with a third embodiment of the present invention.
Figure 6B:
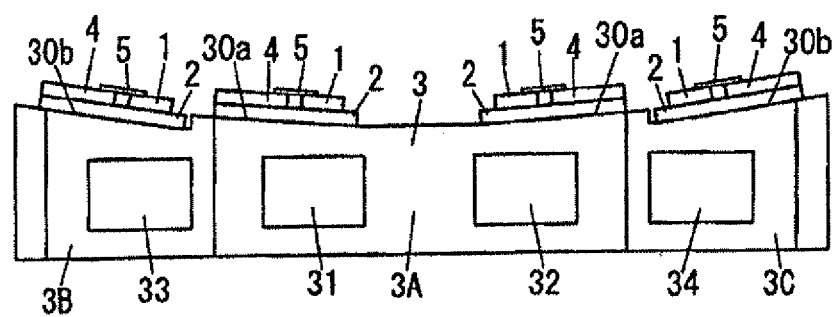

As shown in FIGS. 6A and 6E, in the LED unit of the present embodiment, the heat radiation member 3 of the second embodiment is divided into multiple portions in a width direction thereof, and a base block is disposed at an inclined surface of each divided portion of the heat radiation member.

In this embodiment, the heat radiation member 3 includes a rectangular heat radiation member 3A and rectangular heat radiation members 3B and 3C attached to both sides in the width direction of the heat radiation member 3A.

In the heat radiation member 3A, two inclined surfaces 30a inclined in opposite directions are formed at both sides in the width direction of the heat radiation member 3A, so that the base block 2 on which the LED modules 1 are mounted is disposed on each inclined surface 30a.

The heat radiation members 3B and 3C are attached to the long lateral sides of the heat radiation member 3A. The inclined surfaces 30b formed at the heat radiation members 3B and 3C are inclined in the opposite directions, and the base block 2 on which the LED modules 1 are mounted is disposed on each inclined surface 30b. The heat radiation members 3B and 3C are attached to the heat radiation member 3A by soldering, a thermally conductive adhesive, an engaging member, a fixing member or the like.

By dividing the heat radiation member 3 into the heat radiation members 3A to 3C and providing the base blocks 2 on the divided heat radiation members 3A to 3C, the heat radiation of the heat radiation members can be individually controlled.

Besides, a heat radiation member (not shown) can be further disposed at the outside of the heat radiation members 3B and 3C. In that case, the base blocks 2 can be disposed in six or more rows. In other words, a desired irradiation area can be obtained by adjusting the number of the heat radiation members in accordance with an irradiation range in a lengthwise direction of a target object. By standardizing the shape, size and installation method of the heat radiation member, it is possible to provide LED units with various specifications while reducing the cost.

Like reference numerals refer to like parts in the second embodiment, and redundant description thereof has been omitted.

(Fourth Embodiment)

Figure 7:
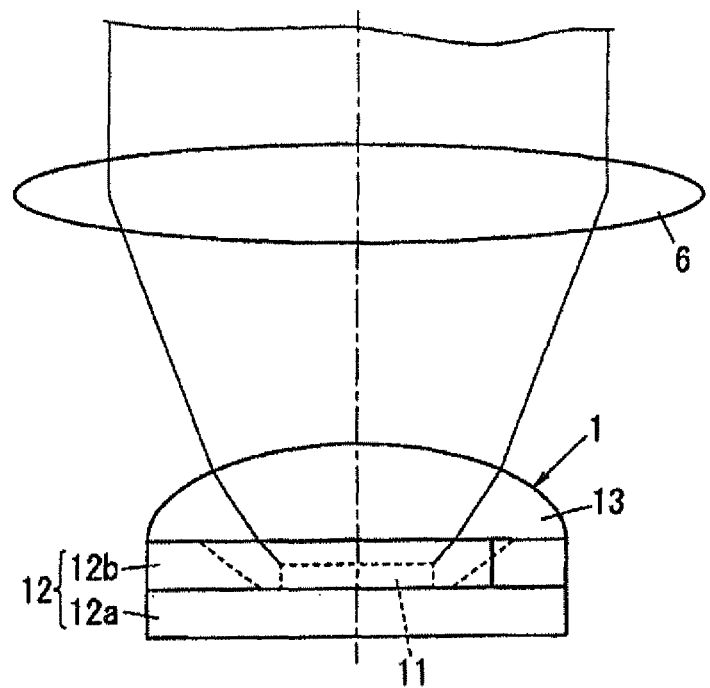
FIG. 7 represents a schematic configuration of an optical system in accordance with a fourth embodiment of the present invention.

In the LED unit of the present embodiment, an optical system is configured by providing a lens 6 (second lens) on an ultraviolet ray irradiation path of an LED module 1 in any one of the first to third embodiments, as shown in FIG. 7. The lens 6 has a function of controlling distribution of ultraviolet rays emitted from the lens 13 (first lens) of the LED module 1, so that the optical system can be optimized and the irradiation efficiency can be improved.

Figure 8A:
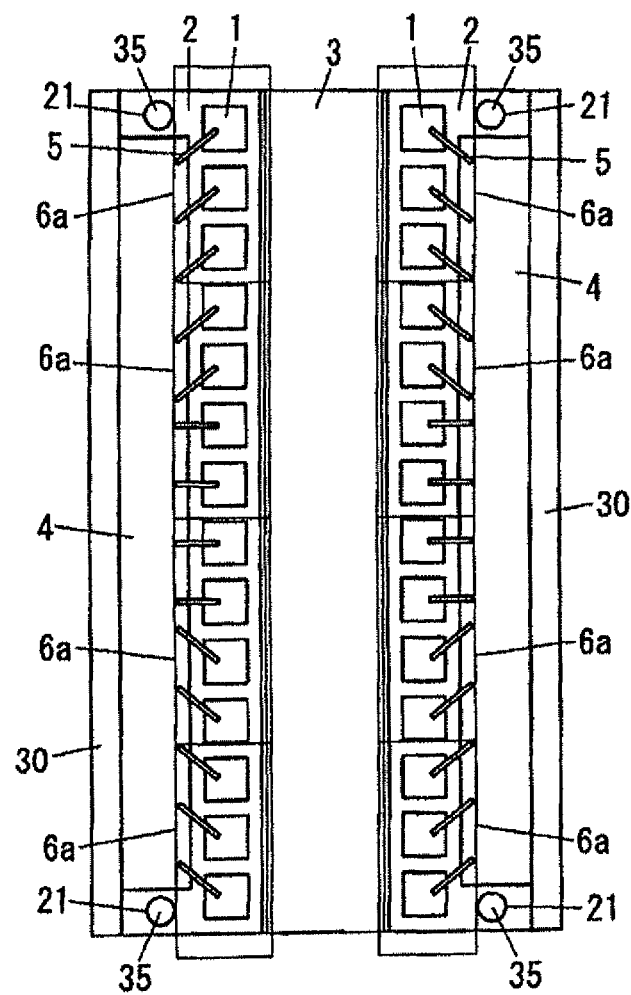
FIGS. 8A and 8B are plan views illustrating a configuration of an LED unit in the optical system in accordance with the fourth embodiment.
Figure 8B:
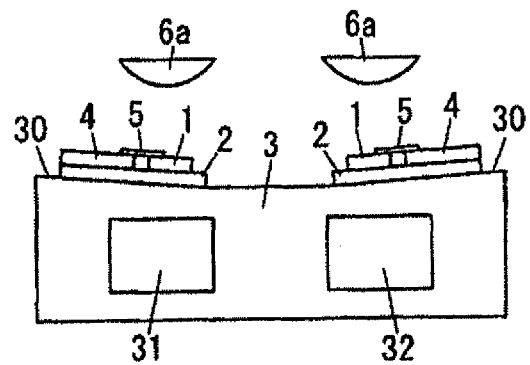

FIGS. 8A and 8B show an example in which a cylindrical lens 6a is used as the lens 6. The cylindrical lens 6a has a semi-circular shape having a curvature in one direction and having no curvature in the other direction perpendicular thereto. For example, as shown in FIG. 8A, a single cylindrical lens 6a is disposed on each ultraviolet ray path of three or four LED modules 1, and end surfaces in the axial direction of the cylindrical lenses 6a are connected to each other continuously in the lengthwise direction of the heat radiation member 3.

The light incident to the cylindrical lens 6a serves as a lens in one direction with curvature and serves as a flat glass in the other direction without curvature. By using this cylindrical lens 6a, the distribution of the ultraviolet ray irradiation intensity in the width direction of the target object (the lengthwise direction of the heat radiation member 3) can become more uniform. As a result, the control of the light distribution can be simplified.

The cylindrical lens 6a may have another shape, e.g., a shape having a substantially elliptical cross section, other than the substantially semi-cylindrical shape shown in FIGS. 8A and 8B.

Moreover, like reference numerals refer to like parts in the first to third embodiments, and redundant description thereof has been omitted.

(Fifth Embodiment)

Figure 9:
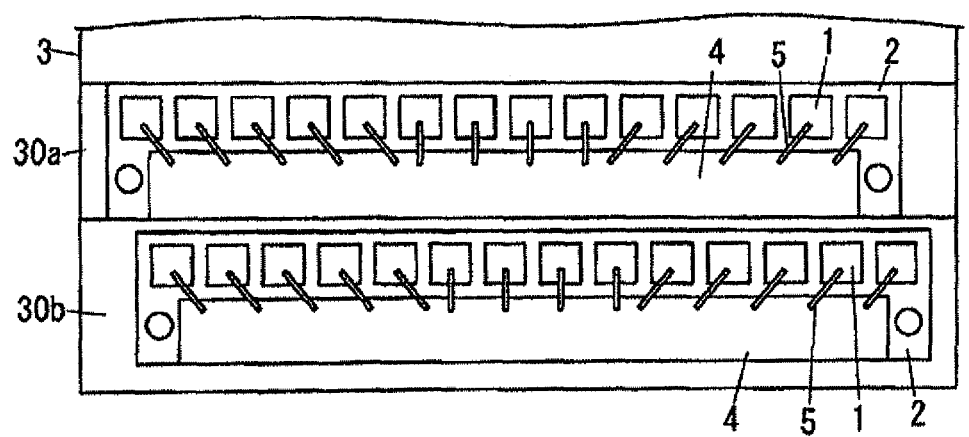
FIG. 9 is a plan view showing a part of a configuration of an LED unit in accordance with a fifth embodiment of the present invention.

In the LED unit of the present embodiment, the base blocks 2 on the inclined surfaces 30a and 30b adjacent to each other in the LED unit of the second embodiment are shifted in the lengthwise direction, as shown in FIG. 9. Specifically, the LED modules 1 on the inclined surfaces 30a and 30b adjacent to each other are arranged in a staggered pattern along the lengthwise direction of the heat radiation member 3.

By arranging the LED modules 1 in a staggered pattern, an irradiation range of a single LED module 1 mounted in one row (inclined surface) is partially overlapped with an irradiation range of two adjacent LED modules 1 in the other row (inclined plane). Hence, the distribution of the ultraviolet ray irradiation intensity in the width direction of the target object (the lengthwise direction of the heat radiation member 3) becomes more uniform, and the control on the light distribution can be simplified.

Figure 10:
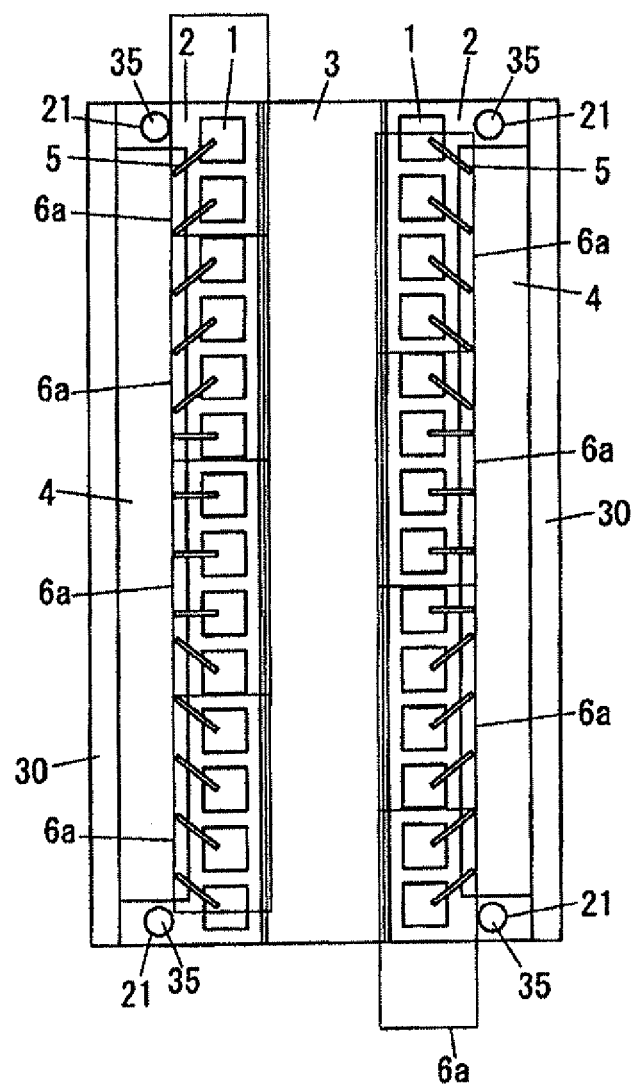
FIG. 10 is a plan view showing another configuration of the LED unit in accordance with the fifth embodiment.

As shown in FIG. 10, when a single cylindrical lens 6a is disposed on every ultraviolet ray irradiation path of the LED modules 1 in the LED unit of the first embodiment, the following configuration can be employed. A cylindrical lens 6a facing one inclined surface 30 and a cylindrical lens 6a facing the other inclined surface 30 are shifted to each other in the lengthwise direction. Thus, the irradiation range of the cylindrical lens 6a facing one inclined surface 30 and that of the cylindrical lens 6a facing the other inclined surface 30 are misaligned in the lengthwise direction. By misaligning the arrangement of the cylindrical lenses 6a, the light distribution can be easily controlled. For example, the distribution of the irradiation intensity of the ultraviolet rays from the LED modules 1 can become more uniform.

Like reference numerals refer to like parts in the first to the fourth embodiment, and redundant description thereof has been omitted.

(Sixth Embodiment)

In the LED unit of the present embodiment, the LED modules 1 in different rows in the LED unit of the second embodiment have different emission wavelengths (emission wavelengths of the LED chips 11).

In the LED unit of the second embodiment (see FIG. 5), the irradiation intensity of the LED modules 1 disposed at two inner inclined surfaces 30a tends to be higher than that of the LED modules 1 disposed at two outer inclined surfaces 30b. Therefore, in the present embodiment, the LED modules 1 are grouped on an inclined surface basis, and the emission wavelengths of the LED modules 1 are set on a group basis.

Figure 11:
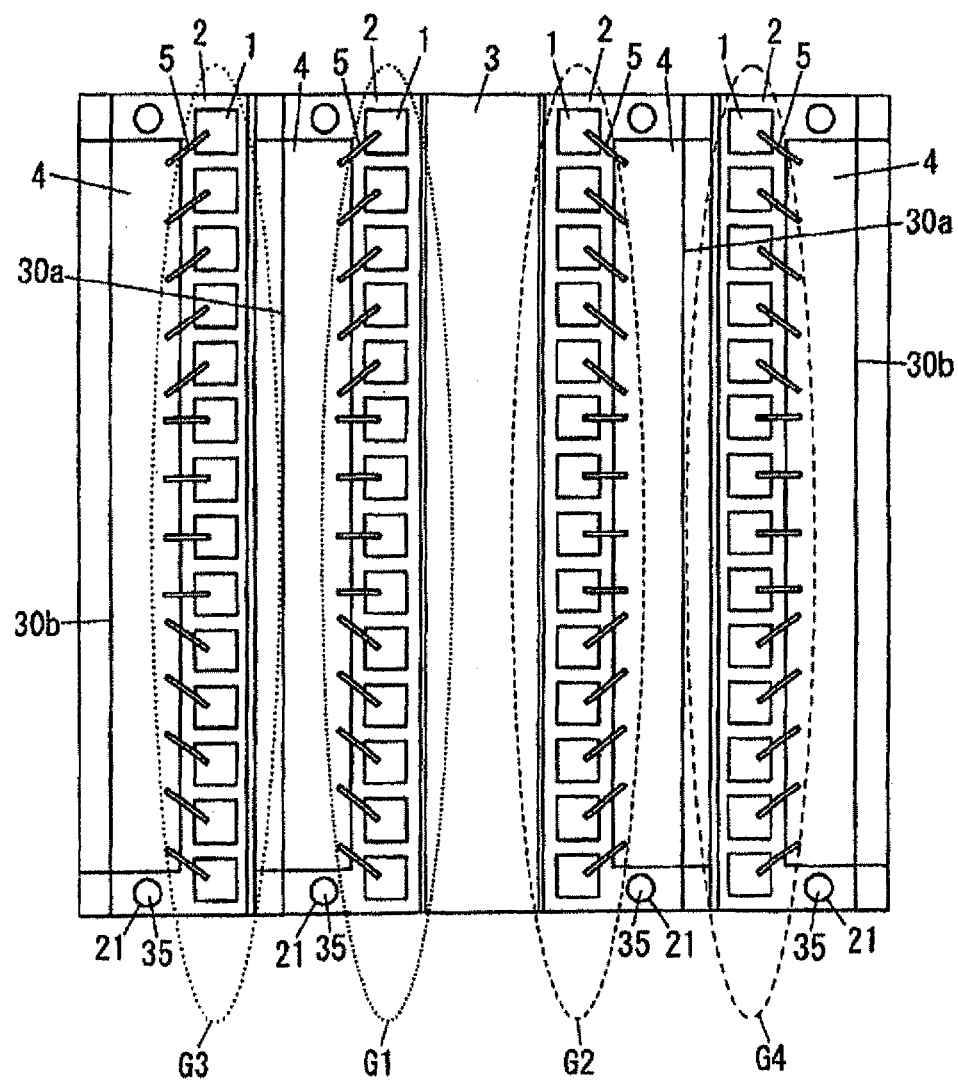
FIG. 11 is a plan view showing a configuration of an LED unit in accordance with a sixth embodiment of the present invention.

In FIG. 11, the LED modules 1 mounted on the two inner inclined surfaces 30a are set to groups G1 and G2, and the LED modules 1 mounted on the two outer inclined planes 30b are set to groups G3 and G4. The emission wavelengths of the LED modules 1 in the inner groups G1 and G2 are set to about 365 nm, and those of the LED modules 1 in the outer groups G3 and G4 are set to about 385 nm. In this case, the LED modules 1 disposed at the outer inclined surfaces 30b (the groups G3 and G4) generate ultraviolet rays having longer wavelengths compared to the LED modules 1 disposed at the inner inclined surfaces 30a (the groups G1 and G2).

Further, the ratio of the wavelengths in the ultraviolet rays can be controlled by controlling the light distribution of the LED modules 1 (the LED current control) on a group basis (on a row basis). In other words, it is possible to easily control the ultraviolet ray irradiation intensity and the irradiation intensity distribution on a wavelength basis. By controlling the light distribution on a group basis in accordance with printing conditions (print speed, the amount of ink and the like), types of ink that can be selected are increased and the ink cost can be reduced.

Further, four wavelengths may be combined instead of combining two wavelengths as described above. For example, the light emitting modules 1 having wavelengths of about 395 nm, 365 nm, 375 nm, and 385 nm are disposed in the groups G3, G1, G2 and G4, respectively. In this case, in both of the left [G1, G3] combination and the right [G2, G4] combination, the light emitting modules 1 disposed at the outer inclined surfaces 30b generate ultraviolet rays having longer wavelengths compared to the light emitting modules 1 disposed at the inner inclined surfaces 30a. In other words, the irradiation intensity is balanced in both of the left [G1, G3] combination and the right [G2, G4] combination.

Thus, the control of the ultraviolet ray irradiation intensity and the irradiation intensity distribution on a wavelength basis can be precisely performed. Further, it is possible to deal with precise printing conditions (printing speed, the amount of ink and the like). In addition, types of ink that can be selected are increased, and the ink cost can be reduced.

The wavelengths of about 365 nm, 375 nm, 385 nm and 395 nm of the LED modules 1 in the present embodiment are examples, and other wavelengths may be employed.

(Seventh Embodiment)

In the LED unit of the present embodiment, four LED modules 1 adjacent to each other in the width direction of the inclined surfaces in the LED unit of the second embodiment are set to one group, and the wavelengths of the LED modules 1 are set on a group basis.

Figure 12:
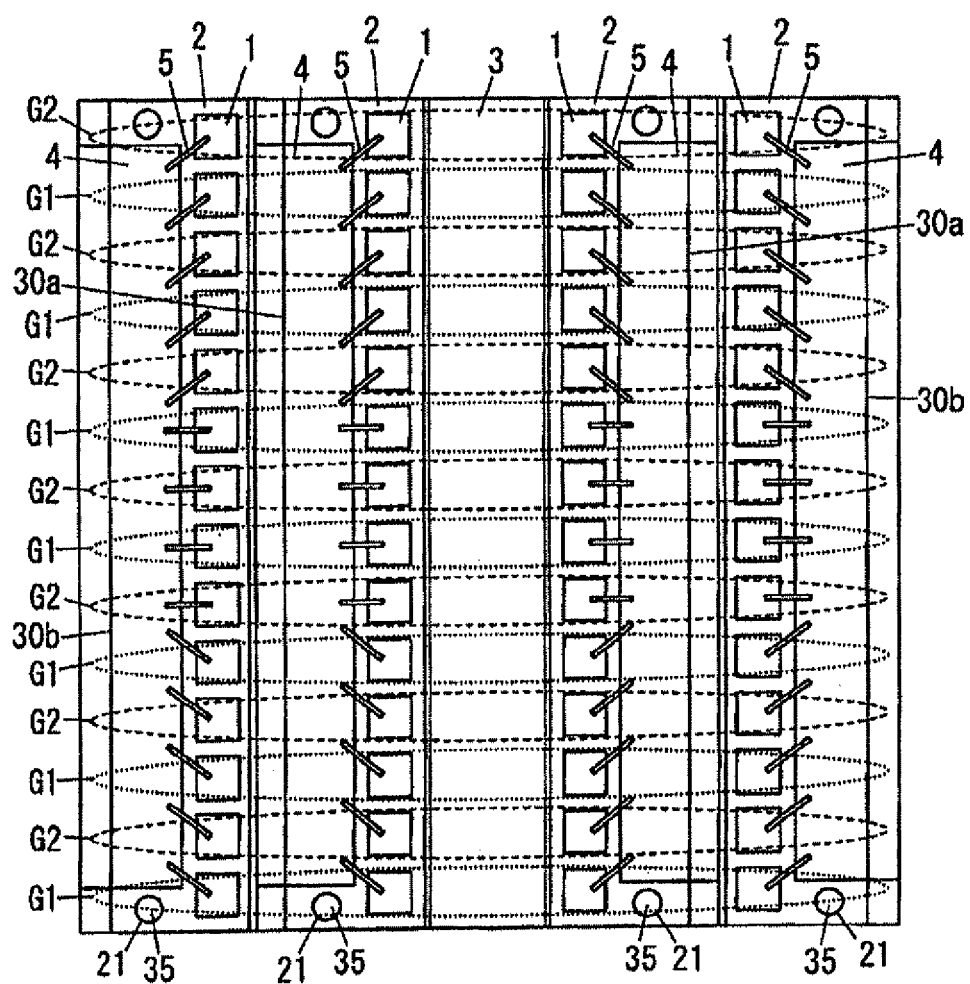
FIG. 12 is a plan view showing a configuration of an LED unit in accordance with a seventh embodiment of the present invention.

In FIG. 12, groups are divided into two groups G1 and G2, each group including four LED modules 1 adjacent to each other in the width direction of the inclined surfaces. The wavelengths of the LED modules 1 in the group G1 are set to about 365 nm, and the wavelengths of the LED modules 1 in the group G2 are set to about 385 nm.

The ratio of the wavelengths of the ultraviolet rays can be adjusted by controlling the light distribution (LED current) of the LED modules 1 on a group basis. In other words, the control of the ultraviolet ray irradiation intensity and the irradiation intensity distribution on a wavelength basis can be easily performed. By controlling the light distribution on a group basis in accordance with the printing conditions (printing speed, the amount of ink and the like), types of ink that can be selected are increased and the ink cost can be reduced. Since a plurality of LED modules 1 having different wavelengths is arranged in the same row, a plurality of wavelengths can be combined regardless of the number of rows (the number of inclined surfaces).

Figure 13:
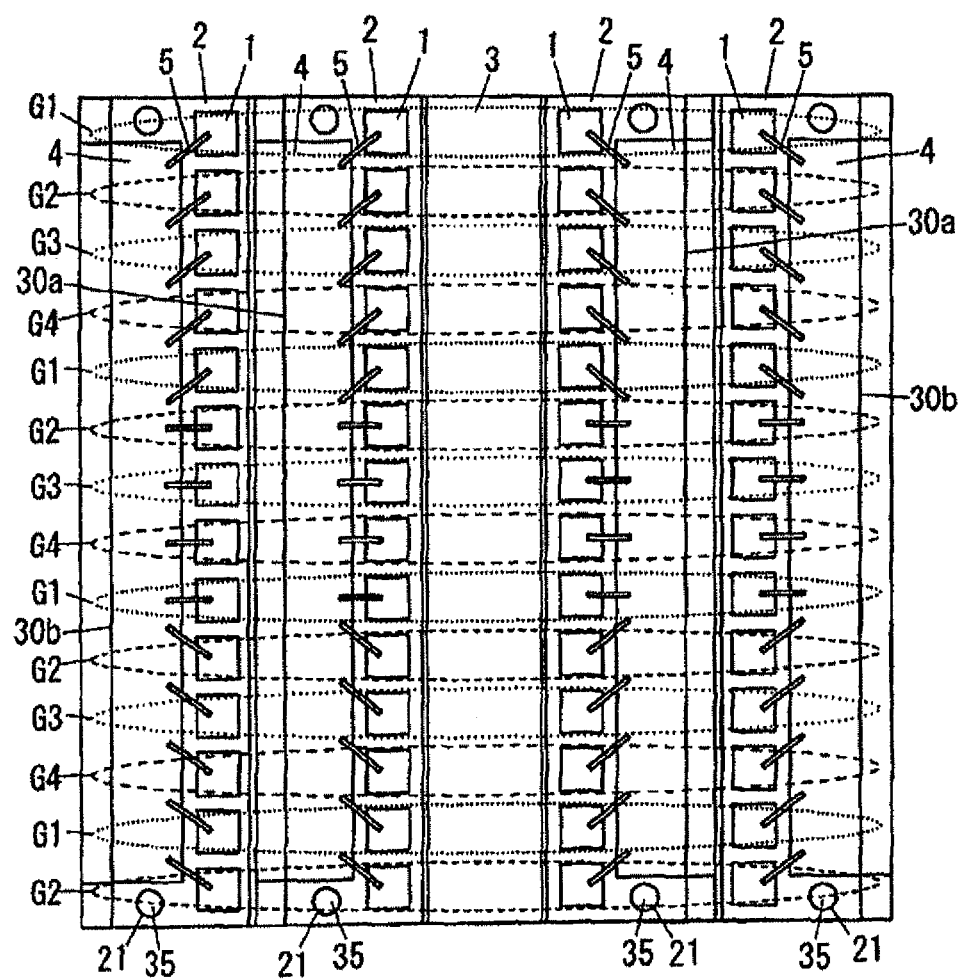
FIG. 13 is a plan view showing another configuration of the LED unit in accordance with the seventh embodiment.
Figure 15A:
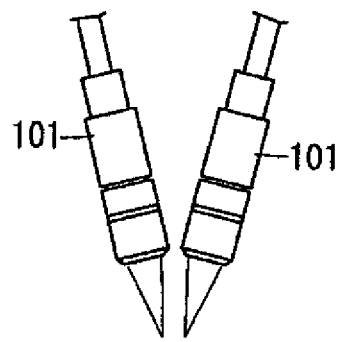
FIGS. 15A and 15B schematically show another conventional LED unit.
Figure 15B:
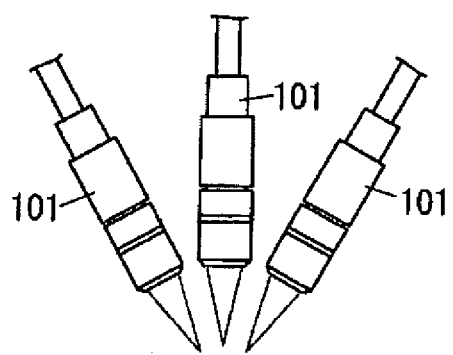

Further, four wavelengths can be combined instead of combining two wavelengths as described above. As shown in FIG. 13, for example, four light emitting modules 1 adjacent to each other in the width direction of the inclined surfaces may belong to one of four groups G1 to G4. In this case, the wavelengths of the LED modules 1 in the group G1 are set to about 365 nm; the wavelengths of the LED modules 1 in the group G2 are set to about 395 nm; the wavelengths of the LED modules 1 in the group G3 are set to about 375 nm; and the wavelengths of the LED modules 1 in the group G4 are set to about 385 nm.

Hence, the control of the ultraviolet ray irradiation intensity and the irradiation intensity distribution on a wavelength basis can be precisely performed, and it is possible to deal with precise printing conditions (printing speed, the amount of ink and the like). Further, types of ink that can be selected are increased, and the ink cost can be reduced.

In the examples shown in FIGS. 12 and 13, four LED modules adjacent to each other in the width direction of the inclined surfaces are set to one group. However, a plurality of LED modules, each being selected from each inclined surface, can be set to one group regardless of whether or not the LED modules are adjacent to each other in the width directions of the inclined surfaces. In that case, the irradiation intensity distribution becomes more uniform without non-uniform distribution of the wavelength in the lengthwise direction of the heat radiation member 3.

The wavelengths of about 365 nm, 375 nm, 385 nm and 395 nm of the LED modules 1 in the present embodiment are examples, and other wavelengths may be employed.

In the above-described embodiments, the heat radiation member 3 is made of a copper plate. However, the heat radiation member 3 may be made of another material such as aluminum or the like. Alternatively, the present invention may be realized by combining the above-described embodiments.

While the invention has been shown and described with respect to the embodiments, it will be understood by those skilled in the art that various changes and modification may be made without departing from the scope of the invention as defined in the following claims.

What is claimed is:

1. An LED unit comprising:
   a plurality of LED modules each having an LED chip for generating ultraviolet ray provided in a package which has an opening formed on one surface and a lens provided to cover the opening of the package;
   substrate-shaped base blocks on which the LED modules are arranged in a first direction; and
   a heat radiation member where the base blocks are provided in a second direction perpendicular to the first direction,
   wherein the heat radiation member has a plurality of inclined surfaces on which the base blocks are disposed, and the inclined surfaces include first inclined surfaces on a first side of the heat radiation member and second inclined surfaces on a second side of the heat radiation member disposed opposite to each other in the second direction and wherein the first inclined surfaces are inclined toward the second inclined surfaces in the second direction, wherein a surface between the first inclined surfaces and second inclined surfaces is a plane area, and
   wherein there is formed a step between every two neighboring first inclined surfaces and every two neighboring second inclined surfaces, the step providing a height difference between every two neighboring first inclined surfaces and every two neighboring second inclined surfaces.

2. The LED unit of claim 1, wherein the heat radiation member is divided into a plurality of portions in the second direction, each divided portion having an inclined surface, and the base blocks are provided at the inclined surfaces of the divided portions, wherein the plurality of portions are attached along lateral sides of the respective plurality of portions.

3. The LED unit of claim 1, wherein the lens is directly coupled to the package.

4. The LED unit of claim 1, wherein the LED unit further includes a lens provided on an irradiation path of ultraviolet rays from the LED modules.

5. The LED unit of claim 4, wherein the lens disposed on the irradiation path of the ultraviolet rays is formed of a cylindrical lens, and a single cylindrical lens is disposed so as to correspond to at least two of the LED modules adjacent to each other in the first direction.

6. The LED unit of claim 1, wherein the LED modules mounted on one of the base blocks and the LED modules mounted on another of the base blocks adjacent thereto in the second direction are staggered zigzag in the first direction.

7. The LED unit of claim 1, wherein the LED modules arranged in the first direction are different in wavelengths of ultraviolet rays emitted therefrom on a row basis in the first direction.

8. The LED unit of claim 1, wherein at least one of the LED modules arranged in the first direction irradiates an ultraviolet ray having a different wavelength from that of other LED modules.

9. The LED unit of claim 6, wherein at least one of the LED modules arranged in the first direction irradiates an ultraviolet ray having a different wavelength from that of other LED modules.

10. The LED unit of claim 1, wherein the number of the base blocks is greater than two and centers of the base blocks are positioned on a straight line.

11. The LED unit of claim 2, wherein each divided portion of the heat radiation member has therein a flow path through which a coolant flows in the first direction, and wherein the flow paths are formed in parallel to each other in the second direction.

12. The LED unit of claim 1, wherein the first inclined surfaces located at the first side are inclined in a clockwise rotational direction and the second inclined surfaces located at the second side are inclined in a counterclockwise rotational direction.

13. The LED unit of claim 1, wherein a LED module is not installed at the plane area between the first inclined surfaces and the second inclined surfaces.

* * * * *